United States Patent
Han

(10) Patent No.: US 10,891,898 B2
(45) Date of Patent: Jan. 12, 2021

(54) PIXEL CIRCUIT FOR TOP-EMITTING AMOLED PANEL AND DRIVING METHOD THEREOF

(71) Applicant: Shenzhen China Star Optoelectronics Semiconductor Display Technology Co., Ltd., Shenzhen (CN)

(72) Inventor: Baixiang Han, Shenzhen (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 206 days.

(21) Appl. No.: 15/579,948

(22) PCT Filed: Nov. 15, 2017

(86) PCT No.: PCT/CN2017/111007
§ 371 (c)(1),
(2) Date: Dec. 6, 2017

(87) PCT Pub. No.: WO2019/037285
PCT Pub. Date: Feb. 28, 2019

(65) Prior Publication Data
US 2019/0066585 A1    Feb. 28, 2019

(30) Foreign Application Priority Data

Aug. 24, 2017  (CN) .......................... 2017 1 0736699

(51) Int. Cl.
G09G 3/3258    (2016.01)
G09G 3/3266    (2016.01)
(Continued)

(52) U.S. Cl.
CPC ......... G09G 3/3258 (2013.01); G09G 3/3233 (2013.01); H01L 27/3262 (2013.01);
(Continued)

(58) Field of Classification Search
None
See application file for complete search history.

(56) References Cited

U.S. PATENT DOCUMENTS 9,460,691 B2    10/2016  Kim
2009/0108763 A1    4/2009  Han et al.
(Continued)

FOREIGN PATENT DOCUMENTS

CN    102222468 A    10/2011
CN    104680978 A    6/2015
(Continued)

*Primary Examiner* — Benjamin C Lee
*Assistant Examiner* — Emily J Frank
(74) *Attorney, Agent, or Firm* — Leong C. Lei

(57) ABSTRACT

The invention discloses a pixel circuit for top-emitting AMOLED panel and driving method thereof. The pixel circuit comprises: first TFT (T1), connected to first node(G), second node(S) and third node(D); second TFT(T2), connected to scan signal(Scan), first node(G) and data signal (Data1); third TFT(T3), connected to scan signal(Scan), second node(S) and reference voltage(Ref); fourth TFT(T4), connected to scan signal(Scan), third node(D) and high voltage power source(Data2); first capacitor(Cst), connected to first node(G) and second node(S); second capacitor(C), connected respectively to third node(D) and reference voltage(Ref); OLED, connected to second node(S) and low voltage power source(VSS); the voltage difference between high voltage power source(Data2) and low voltage power source(VSS) maintaining unchanged. The invention also provides a corresponding driving method. The invention can
(Continued)

effectively relieve the IR voltage drop caused by increased impendence of the transparent cathode.

12 Claims, 3 Drawing Sheets

(51) Int. Cl.
    *H01L 27/32*     (2006.01)
    *G09G 3/3233*     (2016.01)
    *H01L 27/12*     (2006.01)
    *H01L 29/786*     (2006.01)

(52) U.S. Cl.
    CPC ... *G09G 3/3266* (2013.01); *G09G 2300/0819* (2013.01); *G09G 2300/0842* (2013.01); *G09G 2300/0866* (2013.01); *G09G 2320/0204* (2013.01); *H01L 27/1225* (2013.01); *H01L 29/7869* (2013.01); *H01L 29/78672* (2013.01); *H01L 2251/5315* (2013.01)

(56) References Cited

U.S. PATENT DOCUMENTS

| | | | | |
|---|---|---|---|---|
| 2012/0293481 | A1* | 11/2012 | Chaji | G06F 1/3265 345/212 |
| 2013/0127932 | A1* | 5/2013 | Han | G09G 3/3233 345/691 |
| 2015/0302798 | A1* | 10/2015 | Tan | G09G 3/3233 345/698 |
| 2016/0086547 | A1* | 3/2016 | Lebrun | G09G 3/3258 345/205 |
| 2016/0232840 | A1* | 8/2016 | Tseng | G09G 3/3225 |
| 2017/0243542 | A1* | 8/2017 | Xiang | G09G 3/3291 |
| 2018/0005569 | A1* | 1/2018 | Li | G09G 3/3233 |

FOREIGN PATENT DOCUMENTS

| | | |
|---|---|---|
| CN | 105469744 A | 4/2016 |
| CN | 106548752 A | 3/2017 |
| CN | 106935193 A | 7/2017 |
| CN | 107016965 A | 8/2017 |

\* cited by examiner

US 10,891,898 B2

PIXEL CIRCUIT FOR TOP-EMITTING AMOLED PANEL AND DRIVING METHOD THEREOF

BACKGROUND OF THE INVENTION

1. Field of the Invention

The present invention relates to the field of display techniques, and in particular to a pixel circuit for top-emitting AMOLED panel and driving method thereof.

2. The Related Arts

The organic light-emitting diode (OLED) has the advantages of low power consumption, wide color gamut, high brightness, high resolution, wide viewing angle, and fast response time, and attracts much attention.

The driving types of OLED can be divided, according to the driving method, into the passive matrix OLED (PMOLED) and active matrix OLED (AMOLED); wherein the AMOLED provides the advantages of pixels arranged in an array, self-luminous, and high luminous efficiency and is commonly used for high definition large-size display. Based on the light-emission direction, the OLED can be either bottom-emitting type or top-emitting type. The light emitted from the top of the element for top-emitting OLED, and has a higher aperture ratio.

The large-size high-resolution AMOLED panel is the trend. As the resolution increases, the aperture area of the bottom-emitting AMOLED is greatly restricted. Hence, the development of top-emitting structure is imperative. The transparent cathode of the current large-size top-emitting AMOLED panel has a high impedance, resulting in serious IR drop.

Refer to FIG. 1. FIG. 1 shows a known AMOLED 3T1C pixel circuit, comprising: three thin film transistor (TFTs) T1-T3 and a capacitor Cst. The driving process of the pixel circuit is controlled by the scan signal Scan for timing sequence, and the TFT T1 is the driving TFT for driving the OLED by controlling the current flowing through the OLED.

The known AMOLED 3T1C pixel circuit operates as follows: When Scan is at high voltage, T2 and T3 are turned on, the data signal Data is written into node G, the reference voltage Ref(<OLED activation voltage) is written into node S, and Vgs=Data−Ref. At this point, OLED does not emit light. When Scan is at low voltage, T2 and T3 are cut-off, node S is charged to $V_{Anode}$ by the high voltage power source VDD, node G is coupled to Data+$V_{Anode}$−Ref. At this point, Vgs=Data−Ref, and the OLED starts to emit light. T1, as the driving TFT, needs to operate in the saturation zone, in other words, must satisfy Vgs−Vth<VDD−$V_{Anode}$, where Vth is the threshold voltage of T1. For large-size top-emitting AMOLED panel, if the low voltage power source VSS is limited by the high impedance of the transparent cathode and a larger IR voltage drop occurs, the VSS rises and causes the $V_{Anode}$ to rise, resulting in T1 operating in the linear zone, or $V_{Anode}$>VDD, the current pixel circuit is rendered failed.

SUMMARY OF THE INVENTION

The object of the present invention is to provide a pixel circuit for top-emitting AMOLED panel, to solve the circuit failure caused by the voltage raise of the low voltage power source VSS.

Another object of the present invention is to provide a driving method for the pixel circuit for top-emitting AMOLED panel, to solve the circuit failure caused by the voltage raise of the low voltage power source VSS.

To achieve the above object, the present invention provides a pixel circuit for top-emitting AMOLED panel, which comprises:

a first thin film transistor (TFT), having a gate connected to a first node, a source and a drain connected respectively to a second node and a third node;

a second TFT, having a gate connected to a scan signal, a source and a drain connected respectively to the first node and a data signal;

a third TFT, having a gate connected to the scan signal, a source and a drain connected respectively to the second node and a reference voltage;

a fourth TFT, having a gate connected to the scan signal, a source and a drain connected respectively to the third node and a high voltage power source;

a first capacitor, having two ends connected respectively to the first node and the second node;

a second capacitor, having two ends connected respectively to the third node and the reference voltage;

an OLED, having an anode connected to the second node, and a cathode connected to a low voltage power source;

wherein the high voltage power source having a voltage determined by the low voltage power source, voltage difference between the high voltage power source and the low voltage power source maintaining unchanged, the reference voltage being less than activation voltage of the OLED.

According to a preferred embodiment of the present invention, the scan signal has timing sequence configured for a compensation phase and a light-emitting phase.

According to a preferred embodiment of the present invention, in the compensation phase, the scan signal is at high voltage.

According to a preferred embodiment of the present invention, in the light-emitting phase, the scan signal is at low voltage.

According to a preferred embodiment of the present invention, the reference voltage maintains unchanged.

According to a preferred embodiment of the present invention, the first TFT, the second TFT, the third TFT and the fourth TFT are low temperature polysilicon (LTPS) TFTs or oxide semiconductor TFTs.

The present invention also provides a driving method for the aforementioned pixel circuit for top-emitting AMOLED panel, which comprises: the scan signal having timing sequence configured for a compensation phase and a light-emitting phase.

According to a preferred embodiment of the present invention, in the compensation phase, the scan signal is at high voltage.

According to a preferred embodiment of the present invention, in the light-emitting phase, the scan signal is at low voltage.

According to a preferred embodiment of the present invention, the reference voltage maintains unchanged.

The present invention also provides a pixel circuit for top-emitting AMOLED panel, which comprises:

a first thin film transistor (TFT), having a gate connected to a first node, a source and a drain connected respectively to a second node and a third node;

a second TFT, having a gate connected to a scan signal, a source and a drain connected respectively to the first node and a data signal;

a third TFT, having a gate connected to the scan signal, a source and a drain connected respectively to the second node and a reference voltage;

a fourth TFT, having a gate connected to the scan signal, a source and a drain connected respectively to the third node and a high voltage power source;

a first capacitor, having two ends connected respectively to the first node and the second node;

a second capacitor, having two ends connected respectively to the third node and the reference voltage;

an OLED, having an anode connected to the second node, and a cathode connected to a low voltage power source;

wherein the high voltage power source having a voltage determined by the low voltage power source, voltage difference between the high voltage power source and the low voltage power source maintaining unchanged, the reference voltage being less than activation voltage of the OLED;

wherein the scan signal having timing sequence configured for a compensation phase and a light-emitting phase;

wherein in the compensation phase, the scan signal being at high voltage;

wherein in the light-emitting phase, the scan signal being at low voltage;

wherein the reference voltage maintaining unchanged.

In summary, the pixel circuit for top-emitting AMOLED panel and driving method of the present invention can effectively relieve the IR voltage drop caused by impedance increase of the transparent cathode and solve the circuit failure problem caused by VSS voltage raise as well as keeping the voltage difference between VDD and VSS without increasing power consumption. As such, the present invention is applicable to large-size top-emitting AMOLED panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
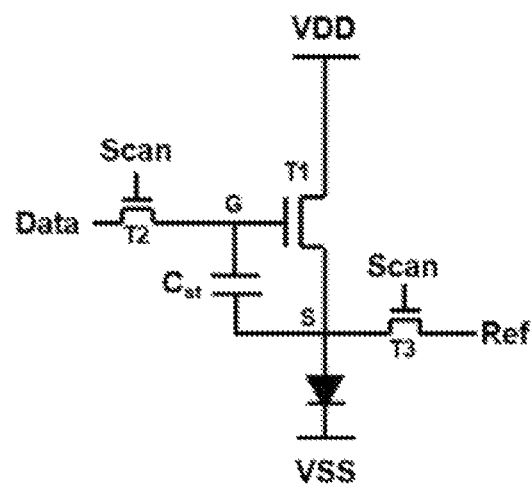
FIG. 1 is a schematic view showing a known 3T1C pixel circuit of AMOLED.
Figure 2:
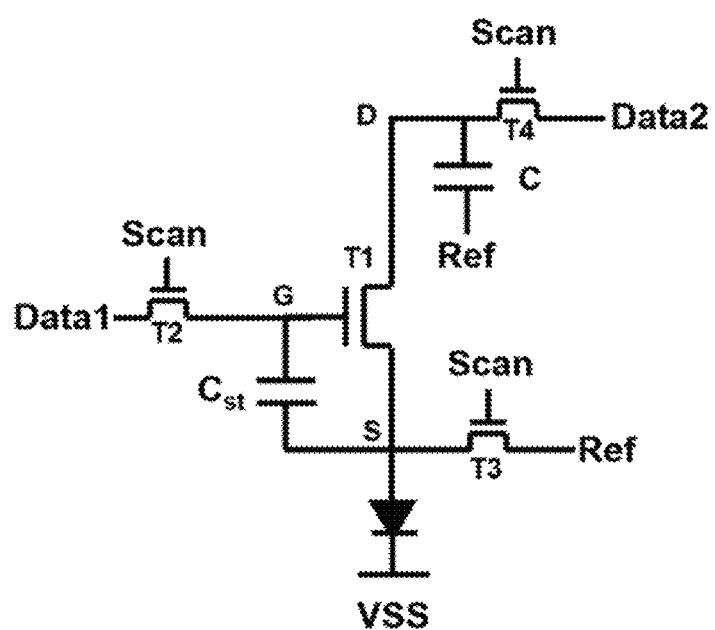
FIG. 2 is a schematic view showing the structure of a preferred embodiment of the pixel circuit for top-emitting AMOLED panel of the present invention.
Figure 3:
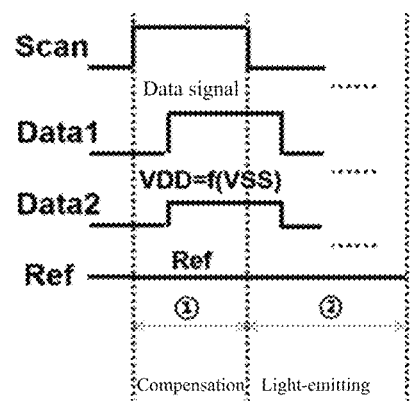
FIG. 3 is a schematic view showing the signal timing sequence of a preferred embodiment of the pixel circuit for top-emitting AMOLED panel of the present invention.

Referring to FIG. 2 and FIG. 3, FIG. 2 is a schematic view showing the structure of a preferred embodiment of the pixel circuit for top-emitting AMOLED panel of the present invention; FIG. 3 is a schematic view showing the signal timing sequence of a preferred embodiment of the pixel circuit for top-emitting AMOLED panel of the present invention. The preferred embodiment is a 4T2C pixel circuit, comprising: four TFTs T1-T4, and two capacitor Cst and C; wherein T1 serving as a driving TFT, T1, having a gate connected to node G, a source and a drain connected respectively to node S and node D; T2, having a gate connected to scan signal Scan, a source and a drain connected respectively to node G and data signal Data1; T3, having a gate connected to scan signal Scan, a source and a drain connected respectively to node S and reference voltage Ref; T4, having a gate connected to scan signal Scan, a source and a drain connected respectively to node D and high voltage power source Data2; capacitor Cst, having two ends connected respectively to node G and node S; capacitor C, having two ends connected respectively to node D and reference voltage Ref; OLED, having an anode connected to node S, and a cathode connected to low voltage power source VSS. In this preferred embodiment, the high voltage power source Data2 has a voltage determined by the low voltage power source VSS, voltage difference between the high voltage power source Data2 and the low voltage power source VSS maintains unchanged, the reference voltage Ref is less than activation voltage of the OLED and maintains unchanged.

During operation, the scan signal Scan has timing sequenced configured for a compensation phase, also called programming phase, and a light-emitting phase. In compensation phase, the scan signal Scan is at high voltage, and in light-emitting phase, the scan signal Scan is at low voltage.

When Scan is at high voltage, T2, T3, and T4 are turned on, the high voltage power source Data2, specifically named VDD (a function of VSS), is written into node D, that is, the relationship between VDD and VSS can be expressed as VDD=f(VSS), stored in capacitor C; data signal Data1 is written into node G, and the reference voltage Ref(<activation voltage of OLED), Vgs=Data1−Ref, and the OLED does not emit light at this point.

When Scan is at low voltage, T2, T3, and T4 are cut-off. Because the capacitor C stores on the VDD voltage, capacitor C can be used as a voltage source. By design in advance a reasonable capacitance for the capacitor, the capacitor can be sure to provide power to OLED within the duration of a frame. As such, node S is charged by the VDD voltage stored at capacitor C in the capacitor C to $V_{Anode}$, where $V_{Anode}$ is the voltage at the anode of the OLED anode, node G is coupled to Data+$V_{Anode}$−Ref. At this point, Vgs=Data−Ref, and OLED starts to emit light.

Because this circuit is suitable for large-size top-emitting AMOLED panel, the impedance of the transparent cathode is very high, VSS has a serious IR voltage drop, which gets even more serious the closer to the center of the panel. The VDD is set to be a function of VSS and the value of VDD is determined according to VSS. As such, the driving TFT T1 can satisfy Vgs−Vth<VDD (=f(VSS))−$V_{Anode}$, where T1 operates in the saturation zone at this point and the panel can be driven normally. The function relationship between VDD and VSS can be as shown in FIG. 4, which can be determined in advance.

Figure 4:
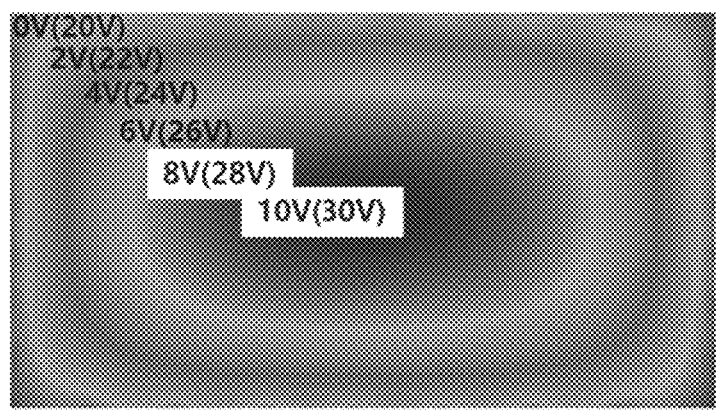
FIG. 4 is a schematic view showing an assumed VSS voltage distribution for a known 3T1C pixel circuit.

Refer to FIG. 4. FIG. 4 is a schematic view showing an assumed VSS voltage distribution for a known 3T1C pixel circuit. Assume that the initial voltage of VDD is 20V, the initial voltage of VSS is 0V, and the VSS IR voltage drop caused by the transparent cathode 10 is as the numbers outside of the parentheses shown in FIG. 4, the number is greater the closer to the center of the panel. The corresponding VDD voltage can be set as the number in the parentheses so that the voltage difference (VDD−VSS) of driver circuit in each zone keeps consistent, without increasing driving power consumption while solving the IR voltage drop issue caused by impedance increase of transparent cathode.

The present invention also provides a corresponding driving method for the pixel circuit. The core is to introduce independently controlled VDD voltages, and the VDD voltages and the VSS voltage distribution have a correspondence relation. The introduction of independently controlled VDD voltages effectively solves the problem of circuit failure caused by raised VSS voltage. By maintaining an unchanged voltage difference between VDD and VSS, no extra power consumption occurs. The pixel circuit for top-emitting AMOLED panel and driving method of the present comprises, but not limited to, LTPS process, oxide semiconductor process. Any similar process and resulted pixel circuit are also within the scope of the present invention. The present invention provides 4T2C pixel circuit, any variation of the TFT dimension, capacitance, and timing sequence is also within the scope of the present invention.

In summary, the pixel circuit for top-emitting AMOLED panel and driving method of the present invention can effectively relieve the IR voltage drop caused by impedance increase of the transparent cathode and solve the circuit failure problem caused by VSS voltage raise as well as keeping the voltage difference between VDD and VSS without increasing power consumption. As such, the present invention is applicable to large-size top-emitting AMOLED panel.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A pixel circuit for top-emitting active matrix organic light-emitting diode (AMOLED) panel, which comprises:
   a first thin film transistor (TFT), having a gate connected to a first node, a source and a drain connected respectively to a second node and a third node;
   a second TFT, having a gate connected to a scan signal, a source and a drain connected respectively to the first node and a data signal;
   a third TFT, having a gate connected to the scan signal, a source and a drain connected respectively to the second node and a reference voltage;
   a fourth TFT, having a gate connected to the scan signal, a source and a drain connected respectively to the third node and a high voltage power source;
   a first capacitor, having two ends connected respectively to the first node and the second node;
   a second capacitor, having two ends connected respectively to the third node and the reference voltage;
   an OLED, having an anode connected to the second node, and a cathode connected to a low voltage power source;
   wherein the high voltage power source having a first voltage determined by a second voltage the low voltage power source, a voltage difference between the first voltage of the high voltage power source and the second voltage of the low voltage power source maintaining unchanged, the reference voltage being less than activation voltage of the OLED;
   wherein the first voltage of the high voltage power source is a function of the second voltage of the low voltage power source and a difference between the voltage of the high voltage power source and the voltage of the low voltage power source maintains unchanged; and
   wherein the fourth TFT and the first TFT are connected, in series, between the high voltage power source and the anode of the OLED, with the end of the second capacitor that is connected to the third node being connected to the connection between the fourth TFT and the first TFT, such that the first voltage of the high voltage power source is applied through the fourth TFT and the first TFT, in sequence, to the anode of the OLED, and wherein the second voltage of the low voltage power source is applied to the cathode of the OLED such that the voltage applied to the anode of the OLED is a function of the voltage applied to the cathode of the OLED.

2. The pixel circuit for top-emitting AMOLED panel as claimed in claim 1, wherein the scan signal has timing sequence configured for a compensation phase and a light-emitting phase.

3. The pixel circuit for top-emitting AMOLED panel as claimed in claim 2, wherein in the compensation phase, the scan signal is at high voltage.

4. The pixel circuit for top-emitting AMOLED panel as claimed in claim 2, wherein in the light-emitting phase, the scan signal is at low voltage.

5. The pixel circuit for top-emitting AMOLED panel as claimed in claim 1, wherein the reference voltage maintains unchanged.

6. The pixel circuit for top-emitting AMOLED panel as claimed in claim 1, wherein the first TFT, the second TFT, the third TFT and the fourth TFT are low temperature polysilicon (LTPS) TFTs or oxide semiconductor TFTs.

7. A driving method for the pixel circuit for top-emitting AMOLED panel as claimed in claim 1, comprising: the scan signal having timing sequence configured for a compensation phase and a light-emitting phase.

8. The driving method for the pixel circuit for top-emitting AMOLED panel as claimed in claim 7, wherein in the compensation phase, the scan signal is at high voltage.

9. The driving method for pixel circuit for top-emitting AMOLED panel as claimed in claim 7, wherein in the light-emitting phase, the scan signal is at low voltage.

10. The driving method for pixel circuit for top-emitting AMOLED panel as claimed in claim 7, wherein the reference voltage maintains unchanged.

11. A pixel circuit for top-emitting active matrix organic light-emitting diode (AMOLED) panel, which comprises:
    a first thin film transistor (TFT), having a gate connected to a first node, a source and a drain connected respectively to a second node and a third node;
    a second TFT, having a gate connected to a scan signal, a source and a drain connected respectively to the first node and a data signal;
    a third TFT, having a gate connected to the scan signal, a source and a drain connected respectively to the second node and a reference voltage;
    a fourth TFT, having a gate connected to the scan signal, a source and a drain connected respectively to the third node and a high voltage power source;
    a first capacitor, having two ends connected respectively to the first node and the second node;

a second capacitor, having two ends connected respectively to the third node and the reference voltage;

an OLED, having an anode connected to the second node, and a cathode connected to a low voltage power source;

wherein the high voltage power source having a first voltage determined by a second voltage of the low voltage power source, a voltage difference between the first voltage of the high voltage power source and the second voltage of the low voltage power source maintaining unchanged, the reference voltage being less than activation voltage of the OLED;

wherein the first voltage of the high voltage power source is a function of the second voltage of the low voltage power source and a difference between the voltage of the high voltage power source and the voltage of the low voltage power source maintains unchanged;

wherein the fourth TFT and the first TFT are connected, in series, between the high voltage power source and the anode of the OLED, with the end of the second capacitor that is connected to the third node being connected to the connection between the fourth TFT and the first TFT, such that the first voltage of the high voltage power source is applied through the fourth TFT and the first TFT, in sequence, to the anode of the OLED, and wherein the second voltage of the low voltage power source is applied to the cathode of the OLED such that the voltage applied to the anode of the OLED is a function of the voltage applied to the cathode of the OLED;

wherein the scan signal having timing sequence configured for a compensation phase and a light-emitting phase;

wherein in the compensation phase, the scan signal being at high voltage;

wherein in the light-emitting phase, the scan signal being at low voltage;

wherein the reference voltage maintaining unchanged.

12. The pixel circuit for top-emitting AMOLED panel as claimed in claim 11, wherein the first TFT, the second TFT, the third TFT and the fourth TFT are low temperature polysilicon (LTPS) TFTs or oxide semiconductor TFTs.

* * * * *